(12) United States Patent
Chow et al.

(10) Patent No.: US 7,863,726 B2
(45) Date of Patent: Jan. 4, 2011

(54) INTEGRATED CIRCUIT PACKAGE SYSTEM WITH PACKAGE SUBSTRATE HAVING CORNER CONTACTS AND METHOD OF MANUFACTURE THEREOF

(75) Inventors: Seng Guan Chow, Singapore (SG); Tae Hoan Jang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/612,630

(22) Filed: Nov. 4, 2009

(65) Prior Publication Data

US 2010/0052150 A1    Mar. 4, 2010

Related U.S. Application Data

(63) Continuation of application No. 11/941,409, filed on Nov. 16, 2007, now Pat. No. 7,646,105.

(51) Int. Cl.
*H01L 23/48* (2006.01)
*H01L 23/52* (2006.01)
*H01L 23/02* (2006.01)
*H01L 29/40* (2006.01)
*H01L 23/28* (2006.01)
*H01L 23/29* (2006.01)
*H01L 23/544* (2006.01)
*H01L 21/44* (2006.01)
*H01L 21/48* (2006.01)
*H01L 21/50* (2006.01)

(52) U.S. Cl. .............. 257/692; 257/678; 257/690; 257/734; 257/787; 257/788; 257/795; 257/797; 257/E21.502; 257/E21.503; 257/E21.504; 257/E23.07; 257/E23.124; 257/E23.127; 257/E23.151; 257/E23.175; 438/106

(58) Field of Classification Search .............. 257/678, 257/787–788, 795, E21.502, E21.503, E21.504, 257/E23.124, E23.127, 690, 692, 734, 797, 257/E23.07, E23.151, E23.175; 438/106
See application file for complete search history.

(56) References Cited

U.S. PATENT DOCUMENTS

| 5,120,678 | A | | 6/1992 | Moore et al. | |
|---|---|---|---|---|---|
| 5,569,960 | A | * | 10/1996 | Kumazawa et al. | 257/738 |
| 5,585,676 | A | | 12/1996 | Uda et al. | |
| 5,648,674 | A | | 7/1997 | Weisfield et al. | |
| 5,767,447 | A | * | 6/1998 | Dudderar et al. | 174/546 |
| 5,828,128 | A | * | 10/1998 | Higashiguchi et al. | 257/738 |
| 6,316,952 | B1 | | 11/2001 | Ahmad et al. | |

(Continued)

OTHER PUBLICATIONS

Michael Kochanowski, Brian Toleno, Improved BGA shock and bend performance using corner glue epoxies, Global SMT & Packaging, Oct. 2006, pp. 26-36, vol. 6, No. 9, Trafalgar Publications Ltd, Glastonbury, United Kingdom.

*Primary Examiner*—Ida M Soward
(74) *Attorney, Agent, or Firm*—Mikio Ishimaru (57) ABSTRACT

A method of manufacture of an integrated circuit package system includes: forming a package substrate with a top substrate side and a bottom substrate side; forming a corner contact in a first corner of the bottom substrate side, the corner contact extending to a substrate edge of the package substrate; mounting an integrated circuit device over the top substrate side; connecting an electrical interconnect between the integrated circuit device and the top substrate side; and forming a package encapsulation over the top substrate side, the integrated circuit device, and the electrical interconnect.

13 Claims, 4 Drawing Sheets

U.S. PATENT DOCUMENTS

| | | |
|---|---|---|
| 6,519,844 B1 * | 2/2003 | Nagarajan et al. ............. 29/841 |
| 6,555,924 B2 * | 4/2003 | Chai et al. ................... 257/788 |
| 6,624,703 B1 | 9/2003 | Chang et al. |
| 6,663,943 B2 * | 12/2003 | Kadota ....................... 428/156 |
| 6,713,878 B2 | 3/2004 | Goetschalckx |
| 6,762,495 B1 | 7/2004 | Reyes et al. |
| 6,849,955 B2 * | 2/2005 | Ho et al. ..................... 257/778 |
| 7,208,776 B2 | 4/2007 | Pham et al. |
| 7,433,201 B2 * | 10/2008 | Cherian ...................... 361/767 |
| 7,564,130 B1 * | 7/2009 | Li ............................... 257/734 |
| 7,586,184 B2 * | 9/2009 | Hung et al. ................. 257/686 |
| 7,626,255 B2 * | 12/2009 | Weekamp et al. ........... 257/690 |
| 7,633,169 B2 * | 12/2009 | Wu ............................. 257/783 |
| 7,656,042 B2 * | 2/2010 | Lii et al. ..................... 257/778 |
| 7,658,616 B2 * | 2/2010 | Hougham et al. ............. 439/66 |
| 2002/0134569 A1 | 9/2002 | Farquhar et al. |
| 2004/0121518 A1 | 6/2004 | Farnworth |
| 2004/0188857 A1 | 9/2004 | Ohnishi et al. |
| 2004/0212097 A1 | 10/2004 | Chen et al. |
| 2005/0023629 A1 | 2/2005 | Ding et al. |
| 2005/0056946 A1 | 3/2005 | Gilleo |
| 2005/0074918 A1 | 4/2005 | Lee et al. |
| 2005/0104180 A1 * | 5/2005 | Lebonheur et al. .......... 257/686 |
| 2005/0133896 A1 * | 6/2005 | Liu et al. .................... 257/678 |
| 2006/0131744 A1 | 6/2006 | O'Connor et al. |
| 2007/0023910 A1 | 2/2007 | Beddingfield |
| 2007/0176280 A1 * | 8/2007 | Do et al. ..................... 257/692 |
| 2008/0142932 A1 * | 6/2008 | Beer et al. ................... 257/659 |

* cited by examiner

INTEGRATED CIRCUIT PACKAGE SYSTEM WITH PACKAGE SUBSTRATE HAVING CORNER CONTACTS AND METHOD OF MANUFACTURE THEREOF

CROSS-REFERENCE TO RELATED APPLICATION(S)

This application is a continuation of co-pending U.S. patent application Ser. No. 11/941,409 filed Nov. 16, 2007.

TECHNICAL FIELD

The present invention relates generally to integrated circuit package system and more particularly to area array package systems having improved solder joint reliability and environmental stresses.

BACKGROUND ART

Integrated circuit packaging technology continues to adjust to ever increasing complexity and density of integrated circuit devices mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density.

This increased integrated circuit density has led to increased use of Ball Grid Array (BGA) packages and other such area array packages to provide the needed high density input/output external contact pads (I/Os). A typical area array package consist of an integrated circuit device mounted on a substrate, the substrate provides mechanical support for the individual integrated circuits and one or more layers of interconnect lines that enable the integrated circuits to be electrically connected to the I/O pads formed as an array of electrical contacts on the bottom surface of the substrate for connectivity to surrounding circuitry. A metal corner pad in one corner is typically used to identify the location of pin 1 of the array of I/O pads.

With the increasing use and expansion in array sizes of the BGAs, tests have shown that these area array packages are more commonly failing at the corner solder connections of these structures. The corner solder joints are susceptible to open joint failure due to environmental conditions, such as impact, bending, vibration, and thermal fatigue failure due to thermal-cycling conditions. A typical solution has been to increase the size of the corner solder ball joints. However, that may result in a corner structure larger than the rest of the solder balls in the array. Another solution is to increase the number of solder balls at the corner connections, but this leads to a risk of fusing these corner solder balls to adjacent solder balls impacting signal integrity.

Thus, a need still remains for an integrated circuit package system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including: forming a package substrate with a top substrate side and a bottom substrate side; forming a corner contact in a first corner of the bottom substrate side, the corner contact extending to a substrate edge of the package substrate; mounting an integrated circuit device over the top substrate side; connecting an electrical interconnect between the integrated circuit device and the top substrate side; and forming a package encapsulation over the top substrate side, the integrated circuit device, and the electrical interconnect.

The present invention provides an integrated circuit package system including: a package substrate with a top substrate side and a bottom substrate side; a corner contact in a first corner of the bottom substrate side, the corner contact extending to a substrate edge of the package substrate; an integrated circuit device over the top substrate side; an electrical interconnect between the integrated circuit device and the top substrate side; and a package encapsulation over the top substrate side, the integrated circuit device, and the electrical interconnect.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Figure 1:
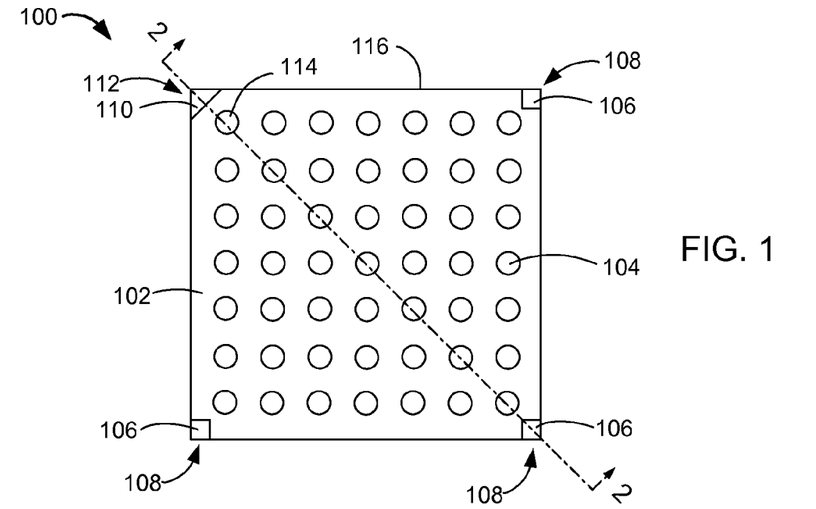
FIG. 1 is a bottom view of an integrated circuit package system in a first embodiment of the present invention.

Referring now to FIG. 1, therein is shown a bottom view of an integrated circuit package system 100 in a first embodiment of the present invention. The bottom view depicts a package substrate 102, such as a laminate structure, having external contacts 104 distributed in an array configuration on the package substrate 102.

A corner contact 106 is provided at each corner 108 of the package substrate 102, with an identification contact 110 formed in a first corner 112 of the package substrate 102 for identifying a pin 1 location 114 for the array of the external contacts 104. The identification contact 110 and each of the corner contact 106 comprise a conductive material such as Au, Cu, combinations thereof, or other such metallic material. Each of the corner contact 106 and the identification contact 110 are formed extending to at least a substrate edge 116 of the package substrate 102. Preferably, the identification contact 110 and each of the corner contact 106 each comprise a geometric configuration, such as a triangle, square, rectangle, combinations thereof, or other configurations, of an equivalent geometric area to avoid misalignment issue from different resultant surface tensions.

The geometric configuration of the identification contact 110 preferably differs from the geometric configuration of the corner contact 106 to facilitate the differentiation of the pin 1 location 114. It is understood that the geometric sizes and shapes of squares and triangles shown herein are merely examples, and the size and shape of the identification contact 110 and the corner contact 106 are not intended to be limited to the sizes and shapes shown. For illustrative purposes, the integrated circuit package system 100 is shown with the external contacts 104 in an evenly distributed array, although it is also understood that the integrated circuit package system 100 may have the external contacts 104 in a different or non-evenly distributed configuration over the package substrate 102.

Figure 2:
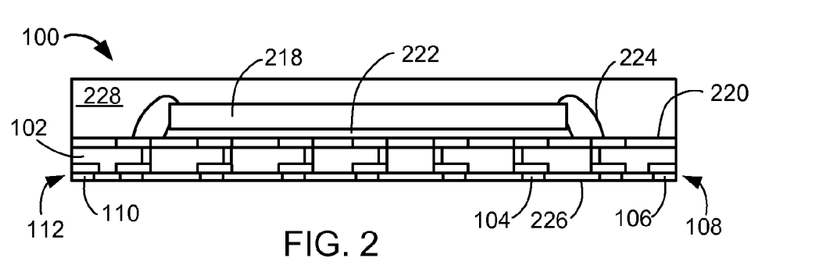
FIG. 2 is a cross-sectional view of the integrated circuit package system of FIG. 1 along line 2-2.

Referring now to FIG. 2, therein is shown a cross-sectional view of the integrated circuit package system 100 along the diagonal line 2-2 of FIG. 1. The cross-sectional view depicts the integrated circuit package system 100 having an integrated circuit device 218, such as an integrated circuit die, a flip chip or a packaged integrated circuit device, mounted over a top substrate side 220 of the package substrate 102 with an adhesive 222, such as a die-attach adhesive. On a bottom substrate side 226 of the package substrate 102, the identification contact 110 is at the first corner 112 and the corner contact 106 is at the corner 108 diagonally opposing the first corner 112, with the external contacts 104 distributed on the bottom substrate side 226, between the identification contact 110 and the corner contact 106. An electrical interconnect 224, such as bond wire or ribbon bond, electrically connects the integrated circuit device 218 to the top substrate side 220.

A package encapsulation 228 is formed covering the top substrate side 220, the electrical interconnect, and the integrated circuit device 218. Optionally, solder balls (not shown) may be attached to the bottom substrate side 226, such as under the identification contact 110, the corner contact 106, and the external contacts 104 to facilitate connection to the next system level (not shown), such as a printed circuit board or another integrated circuit package system.

For illustrative purposes, the integrated circuit device 218 is shown as a wire bond integrated circuit, although it is understood that the integrated circuit device 218 may be of a different type of integrated circuits. For example, the integrated circuit device 218 may be an integrated circuit die, a packaged integrated circuit device, a flip chip, or a combination thereof.

Figure 3:
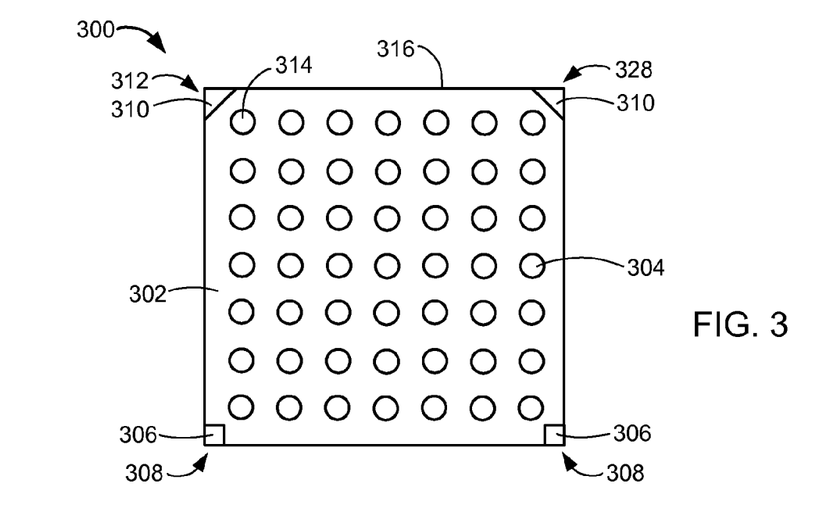
FIG. 3 is a bottom view of an integrated circuit package system in a second embodiment of the present invention.

Referring now to FIG. 3, therein is shown a bottom view of an integrated circuit package system 300 in a second embodiment of the present invention. The integrated circuit package system 300 includes structural similarities to the integrated circuit package system 100 of FIG. 1. The bottom view depicts a package substrate 302, such as a laminate structure, having external contacts 304 distributed in an array configuration on the package substrate 302.

A corner contact 306 is provided at each corner 308 of the package substrate 302, with an identification contact 310 formed in a first corner 312 of the package substrate 302 and a second corner 328 of the package substrate 302 adjacent to the first corner 312. The identification contact 310 at the first corner 312 and at the second corner 328 together identify a pin 1 location 314 for the array of the external contacts 304. The identification contact 310 and the corner contact 306 each comprises a conductive material such as Au, Cu, combinations thereof, or other such metallic material. The corner contact 306 and the identification contact 310 are each formed extending to at least a substrate edge 316 of the package substrate 302. Preferably, the identification contact 310 and the corner contact 306 each comprise a geometric configuration, such as a triangle, square, rectangle, combinations thereof, or other configurations, of an equivalent geometric area to avoid misalignment issue from different resultant surface tensions.

The geometric configuration of the identification contact 310 preferably differs from the geometric configuration of the corner contact 306 to facilitate the differentiation of the pin 1 location 314. It is understood that the geometric sizes and shapes of squares and triangles shown herein are merely examples, and the size and shape of the identification contact 310 and the corner contact 306 are not intended to be limited to the sizes and shapes shown.

For illustrative purposes, the integrated circuit package system 300 is shown with the external contacts 304 in an evenly distributed array, although it is also understood that the integrated circuit package system 300 may have the external contacts 304 in a different or non-evenly distributed configuration over the package substrate 302. It has been discovered that a unique pair of identification contacts along a substrate edge provides a unique pattern to facilitate pattern recognition of pin 1 location by a pattern recognition system.

Figure 4:
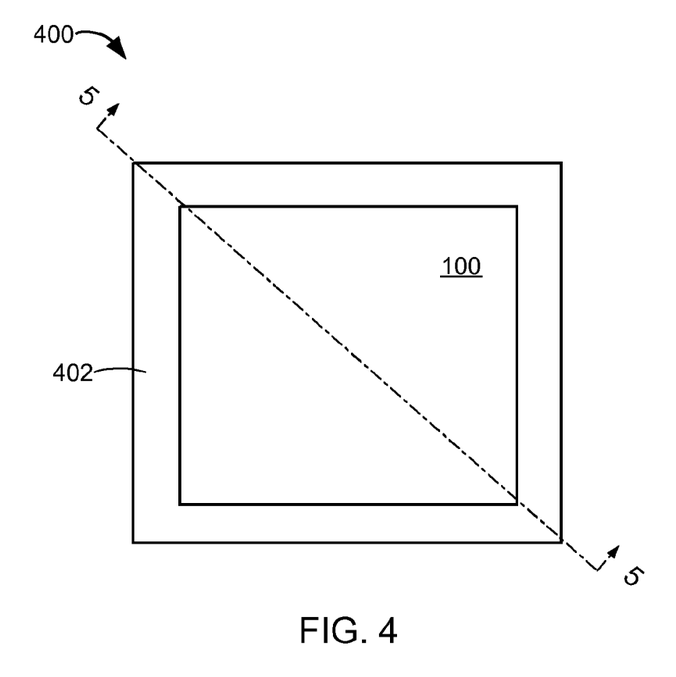
FIG. 4 is a top view of an integrated circuit board system in an application with the integrated circuit package system of FIG. 1 in a third embodiment of the present invention.

Referring now to FIG. 4, therein is shown a top view of an integrated circuit board system 400 in an application with the integrated circuit package system 100 of FIG. 1 in a third embodiment of the present invention. The integrated circuit board system 400 may be formed with other embodiments of the present inventions, such as the integrated circuit package system 300 of FIG. 3. The top view depicts the integrated circuit package system 100 mounted over a board substrate 402, such as a laminate of a printed circuit board.

Figure 5:
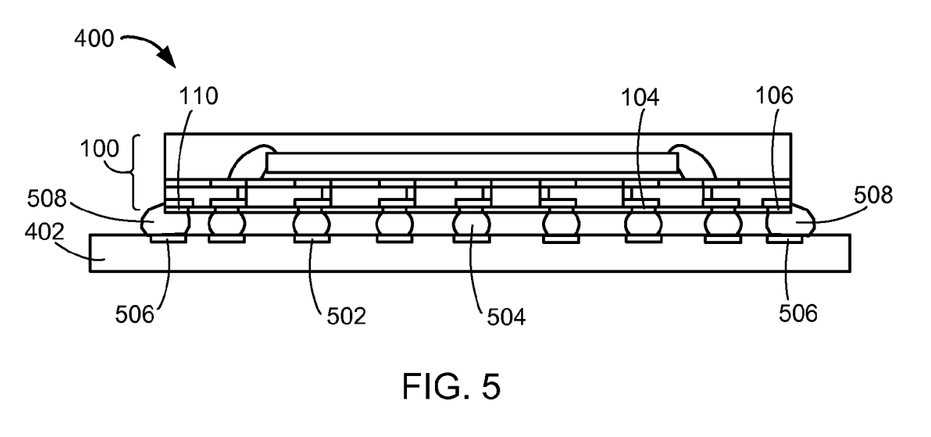
FIG. 5 is a cross-sectional view of the integrated circuit board system along 5-5 of FIG. 4.

Referring now to FIG. 5, therein is shown a cross-sectional view of the integrated circuit board system 400 along the diagonal line 5-5 of FIG. 4. The integrated circuit package system 100 is mounted over the board substrate 402. The board substrate 402 includes board contacts 502 that connect to the external contacts 104 and board corner contacts 506 that connect to the identification contact 110 and the corner contact 106. The board contacts 502 and the board corner contacts 506 each comprises conductive material such as Au, Cu, combinations thereof, or other such metallic material. Non-corner solder balls 504 connect between the board contacts 502 and the external contacts 104. Corner solder balls 508 connect between the board corner contacts 506 and the identification contact 110 and the corner contact 106.

It has been discovered that the present invention provides reinforcement joints at the corners of the bottom substrate side by having the corner contact and the identification contact extending to a substrate edge of the package substrate. Having the corner contact and the identification contact at a substrate edge away from the inner external contacts avoids solder ball of the corner contact fusing with the solder ball of the external contacts in forming reinforcement joints.

It has also been discovered that the corner contact and the identification contact may serve as grounding pads such as by connecting the corner contact or the identification contact to a ground potential on the board substrate. It has further been discovered that having an identification contact extending to a substrate edge on a bottom substrate side provides a unique pattern to facilitate pattern recognition of pin 1 location by a pattern recognition system.

Moreover, providing corner contacts extending to the edge of the bottom substrate side of the package substrate provide additional reinforcement of solder joints at the corners, without sacrificing the existing corner ball layout.

Figure 6:
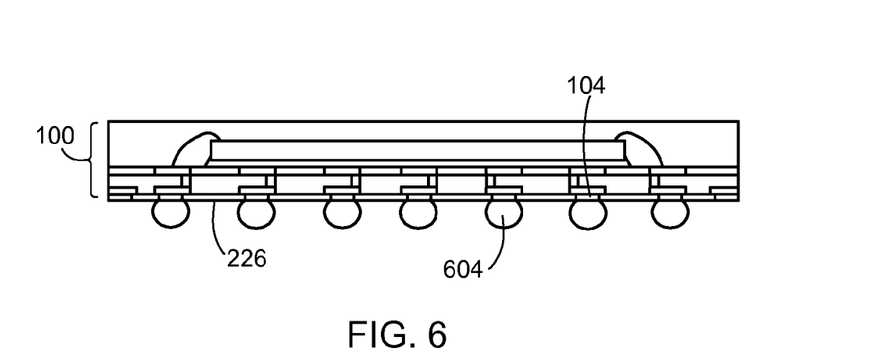
FIG. 6 is a cross-sectional view of the integrated circuit package system structure in a ball attachment phase.

Referring now to FIG. 6, therein is shown a cross-sectional view of the integrated circuit package system 100 of FIG. 5 in an external interconnect attachment phase. Preferably, external interconnects 604 such as solder bumps are first attached to the bottom substrate side 226 under the external contacts 104 prior to a board mounting phase.

Figure 7:
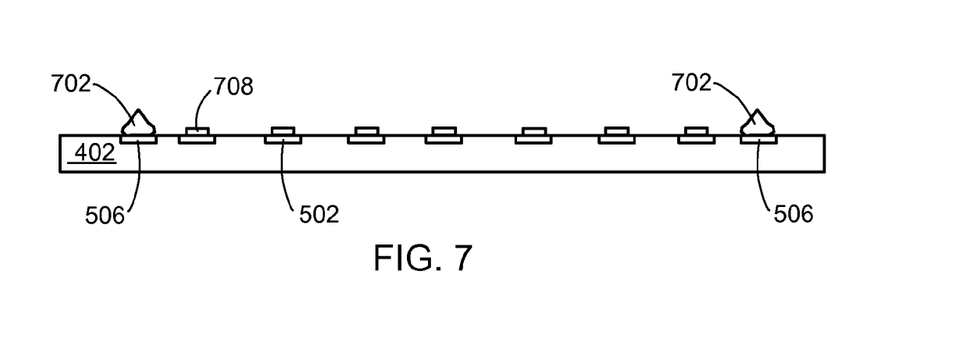
FIG. 7 is a cross-sectional view of the board substrate structure in a board preparation phase.

Referring now to FIG. 7, therein is shown a cross-sectional view of the board substrate 402 of FIG. 5 in a board preparation phase. A conductive deposit 702, such as solder paste, epoxy glue, thermal interface material, or polymeric material, is formed over the board corner contacts 506, such as by a dispensing or a screen printing method, prior to a later mounting phase to connect the identification contact 110 of FIG. 5 and the corner contact 106 of FIG. 5 to the board corner contacts 506. A conductive layer 708, such as solder paste is formed over the board contacts 502, such as by a dispensing or a screen printing method, prior to a later mounting phase to connect the external contacts 104 of FIG. 5 to the board contacts 502.

Figure 8:
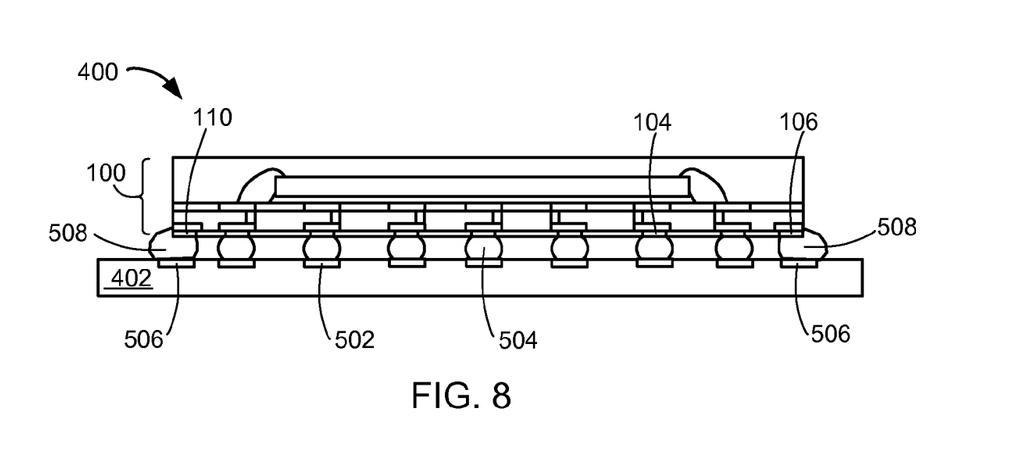
FIG. 8 is a cross-sectional view of the integrated circuit board system during the mounting phase.

Referring now to FIG. 8, therein is shown a cross-sectional view of the integrated circuit board system 400 of FIG. 5 during the mounting phase of the integrated circuit package system 100. The integrated circuit package system 100 is mounted over the board substrate 402 such as by solder reflow process to connect the external interconnects 604 of FIG. 6 to the board contacts 502 and the board corner contacts 506. The corner solder balls 508 at the board corner contacts 506 are formed from the conductive deposit 702 of FIG. 7 connecting the identification contact 110 and the corner contact 106 to the board substrate 402. The non-corner solder balls 504 such as from the external interconnects 604 of FIG. 6 fused to the conductive layer 708 of FIG. 7 connect the external contacts 104 to the board contacts 502.

Figure 9:
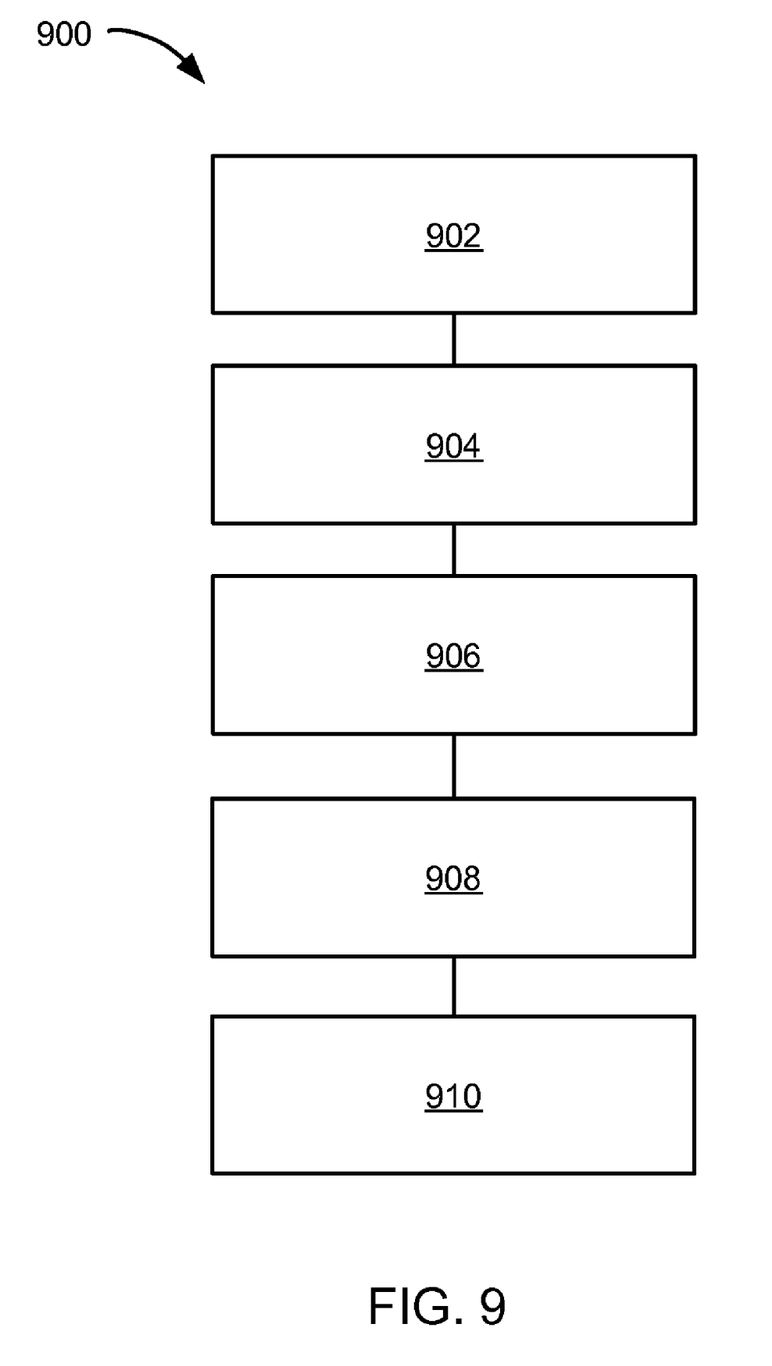
FIG. 9 is a flow chart of a method of manufacture of the integrated circuit package system in an embodiment of the present invention.

Referring now to FIG. 9, therein is shown a flow chart of a method 900 of manufacture of the integrated circuit package system in an embodiment of the present invention. The method 900 includes: forming a package substrate with a top substrate side and a bottom substrate side in a block 902; forming a corner contact in a first corner of the bottom substrate side, the corner contact extending to a substrate edge of the package substrate in a block 904; mounting an integrated circuit device over the top substrate side in a block 906; connecting an electrical interconnect between the integrated circuit device and the top substrate side in a block 908; and forming a package encapsulation over the top substrate side, the integrated circuit device, and the electrical interconnect in a block 910.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   forming a package substrate with a top substrate side and a bottom substrate side;
   forming a corner contact in a first corner of the bottom substrate side, the corner contact extending to a substrate edge of the package substrate;

forming an identification contact in a second corner of the bottom substrate side, the identification contact and the corner contact having different geometric configurations;

mounting an integrated circuit device over the top substrate side;

connecting an electrical interconnect between the integrated circuit device and the top substrate side; and forming a package encapsulation over the top substrate side, the integrated circuit device, and the electrical interconnect.

2. The method as claimed in claim 1 wherein forming the identification contact in the second corner of the bottom substrate side, side includes the identification contact and the corner contact having an equivalent geometric area.

3. The method as claimed in claim 1 further comprising forming a first identification contact in the second corner of the package substrate and a second identification contact in a third corner of the package substrate, adjacent to the second corner.

4. The method as claimed in claim 1 further comprising:
providing a board substrate having a board corner contact; and
mounting the package substrate over the board substrate with the corner contact over the board corner contact.

5. An integrated circuit package system comprising:
a package substrate with a top substrate side and a bottom substrate side;
a corner contact in a first corner of the bottom substrate side, the corner contact extending to a substrate edge of the package substrate;
an identification contact in a second corner of the bottom substrate side, the identification contact and the corner contact having different geometric configurations;
an integrated circuit device over the top substrate side;
an electrical interconnect between the integrated circuit device and the top substrate side; and
a package encapsulation over the top substrate side, the integrated circuit device, and the electrical interconnect.

6. The system as claimed in claim 5 wherein the identification contact in the second corner of the bottom substrate, side includes the identification contact and the corner contact having an equivalent geometric area.

7. The system as claimed in claim 5 further comprising a first identification contact in the second corner of the package substrate and a second identification contact in a third corner of the package substrate, adjacent to the second corner.

8. The system as claimed in claim 5 further comprising a board substrate having a board corner contact with the corner contact mounted over the board corner contact.

9. The system as claimed in claim 5 wherein the identification contact in the second corner of the bottom substrate, side with the identification contact extending to the substrate edge of the package substrate.

10. The system as claimed in claim 9 further comprising a corner solder ball between the bottom substrate side and the board substrate.

11. The system as claimed in claim 9 further comprising:
a corner solder ball formed under the corner contact; and
a board substrate, the board substrate having a board corner contact with the corner solder ball connecting between the corner contact and the board corner contact.

12. The system as claimed in claim 9 wherein:
the corner contact and the identification contact includes:
the identification contact and the corner contact having different geometric configurations; and
further comprising:
a board substrate having a board corner contact with the corner contact mounted over the board corner contact.

13. The system as claimed in claim 9 wherein:
the corner contact and the identification contact includes:
the identification contact and the corner contact having an equivalent geometric area; and
further comprising:
a board substrate having a board corner contact with the corner contact mounted over the board corner contact.

* * * * *

UNITED STATES PATENT AND TRADEMARK OFFICE
CERTIFICATE OF CORRECTION

| | | |
|---|---|---|
| PATENT NO. | : 7,863,726 B2 | Page 1 of 1 |
| APPLICATION NO. | : 12/612630 | |
| DATED | : January 4, 2011 | |
| INVENTOR(S) | : Chow et al. | |

It is certified that error appears in the above-identified patent and that said Letters Patent is hereby corrected as shown below:

Column 7:
    Claim 2, lines 13-14, delete "substrate side, side includes" and insert therefor
    --substrate side includes--

Column 8:
    Claim 6, lines 2-3, delete "substrate, side includes" and insert therefor
    --substrate side includes--

Signed and Sealed this
Twenty-sixth Day of July, 2011

David J. Kappos
*Director of the United States Patent and Trademark Office*